US012224754B2

(12) United States Patent
Papotto et al.

(10) Patent No.: US 12,224,754 B2
(45) Date of Patent: Feb. 11, 2025

(54) FREQUENCY MULTIPLIER CIRCUITRY, CORRESPONDING SYSTEM AND VEHICLE

(71) Applicant: STMicroelectronics S.r.l., Agrate Brianza (IT)

(72) Inventors: Giuseppe Papotto, Biancavilla (IT); Andrea Cavarra, Catania (IT); Giuseppe Palmisano, S. Giovanni la Punta (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 273 days.

(21) Appl. No.: 17/838,159

(22) Filed: Jun. 10, 2022

(65) Prior Publication Data

US 2023/0018212 A1 Jan. 19, 2023

(30) Foreign Application Priority Data

Jun. 25, 2021 (IT) .......................... 102021000016724

(51) Int. Cl.
*H03K 5/00* (2006.01)
*G01S 13/931* (2020.01)
*H03F 3/20* (2006.01)

(52) U.S. Cl.
CPC ........ *H03K 5/00006* (2013.01); *G01S 13/931* (2013.01); *H03F 3/20* (2013.01)

(58) Field of Classification Search
CPC ..... H03K 5/00006; G01S 13/931; H03F 3/20; H03B 19/14; H03B 19/10; H03B 19/00; H03B 19/06; G06F 7/68
See application file for complete search history.

(56) References Cited

U.S. PATENT DOCUMENTS 10,116,290 B1 10/2018 Wang et al.
10,355,678 B2 7/2019 Ye et al.
(Continued)

FOREIGN PATENT DOCUMENTS

CN 102104362 A 6/2011

OTHER PUBLICATIONS

Shirazi, A.H.M. et al., "On the Design of mm-Wave Self-Mixing-VCO Architecture for High Tuning-Range and Low Phase Noise," in IEEE Journal of Solid-State Circuits, vol. 51, No. 5, pp. 1210-1222, doi: 10.1109/JSSC.2015.2511158, May 2016, 13 pages.

(Continued)

*Primary Examiner* — Jung Kim
(74) *Attorney, Agent, or Firm* — SLATER MATSIL, LLP

(57) ABSTRACT

A circuit includes frequency multiplier circuitry having input nodes configured to receive an input signal and an anti-phase version thereof, the input signal having a first frequency value, wherein the frequency multiplier circuitry is configured to produce a current signal at a second frequency value that is an even multiple of the first frequency value and a transformer including a primary side and a secondary side, wherein the primary side comprises a primary inductance coupled to the frequency multiplier circuitry to receive the current signal therefrom, wherein the secondary side is configured to provide a frequency multiplied voltage signal, and wherein the frequency multiplier circuitry and the transformer are cascaded between at least one first node and a second node, the at least one first node and the second node couplable to a supply node and ground.

17 Claims, 6 Drawing Sheets

(56) References Cited

U.S. PATENT DOCUMENTS 11,652,446 B2 * 5/2023 Kalia .................. H03D 7/1433
455/323
2011/0175651 A1 7/2011 Chang et al.

OTHER PUBLICATIONS

Jia, H. et al., "A 77 GHz Frequency Doubling Two-Path Phased-Array FMCW Transceiver for Automotive Radar," IEEE Journal of Solid-State Circuits, vol. 51, No. 10, doi: 10.1109/JSSC.2016.2580599, Oct. 2016, 13 pages.

Kueppers, S. et al . . . , "A fully differential 100-140 GHz frequency quadrupler in a 130 nm SiGe:C technology for MIMO radar applications using the bootstrapped Gilbert-Cell doubler topology," 2017 IEEE 17th Topical Meeting on Silicon Monolithic Integrated Circuits in RF Systems (SiRF), doi: 10.1109/SIRF.2017.7874364, 2017, 3 pages.

* cited by examiner

FREQUENCY MULTIPLIER CIRCUITRY, CORRESPONDING SYSTEM AND VEHICLE

CROSS-REFERENCE TO RELATED APPLICATIONS

This application claims the priority of Italian Patent Application No. 102021000016724, filed on Jun. 25, 2021, which application is hereby incorporated herein by reference.

TECHNICAL FIELD

The description relates to circuits and systems for providing radio-frequency (RF) signals, such as frequency multiplier circuitry, for instance. One or more embodiments may be applied, e.g., in automotive radar applications.

BACKGROUND

Increasingly higher demand for driving safety standards has led to a widespread adoption of Advanced Driver Assistance System (ADAS) in the automotive field.

ADAS implement control systems which may exploit several sensors, e.g., radar sensors, to provide functionalities such as adaptive cruise control, collision-avoidance, park assist, for instance.

A vehicle may comprise a plurality of radar sensors to facilitate detecting position and speed of objects nearby. For instance, the radar sensors may operate by transmitting a signal, e.g., millimeter-wave (1 millimeter=1 mm=$10^{-3}$ m) signal (24/77 GHz according to ETSI standard, where 1 GHz=1 GigaHertz=$10^9$ Hz), and receiving an echo signal, reflected by the object nearby.

Direct conversion automotive radar sensors may suffer from so-called "pulling" from transmitter to voltage-controlled oscillator (TX-to-VCO pulling). This is a phenomenon involving signals output from power amplifier, which amplifies a signal generated by the VCO at a transmission frequency that can "leak" back in the VCO, for instance due to finite substrate isolation or parasitic undesired return paths. This "leakage" can corrupt the spectrum of the VCO output signal, which in turns can reduce radar sensitivity. Such an issue may pose severe limitations to radar sensor receiver linearity and performance.

TX-to-VCO pulling may be reduced employing a VCO oscillating at a sub-harmonic frequency of the signal to be transmitted.

Existing solutions are discussed, for instance, in documents:

[1] A. H. Masnadi Shirazi et al., "On the Design of mm-Wave Self-Mixing-VCO Architecture for High Tuning-Range and Low Phase Noise," in IEEE Journal of Solid-State Circuits, vol. 51, no. 5, pp. 1210-1222, May 2016, doi: 10.1109/JSSC.2015.2511158 discussing an analysis and compares the performance of fundamental-mode voltage-controlled oscillators (F-VCOs) to harmonic-mode VCOs (H-VCOs), showing that unlike a mm-wave F-VCO, an H-VCO can simultaneously achieve higher FTR and lower PN while an H-VCO architecture, denoted as self-mixing VCO (SMV), is presented where the VCO core generates both the first and second harmonic and then mixes them together to obtain the desired mm-wave third-harmonic,

[2] S. Kueppers, K. Aufinger and N. Pohl, "A fully differential 100-140 GHz frequency quadrupler in a 130 nm SiGe:C technology for MIMO radar applications using the bootstrapped Gilbert-Cell doubler topology," 2017 IEEE 17th Topical Meeting on Silicon Monolithic Integrated Circuits in RF Systems (SiRF), 2017, pp. 37-39, doi: 10.1109/SIRF.2017.7874364 discusses a frequency quadrupler implemented in a 130 nm SiGe:C technology suitable for radar systems with spatially distributed transmitters and receivers; the circuit is based on cascading the bootstrapped Gilbert-Cell doubler topology with differential inputs and differential outputs,

[3] H. Jia et al., "A 77 GHz Frequency Doubling Two-Path Phased-Array FMCW Transceiver for Automotive Radar," in IEEE Journal of Solid-State Circuits, vol. 51, no. 10, pp. 2299-2311, October 2016, doi: 10.1109/JSSC.2016.2580599 discusses a fully-integrated 77 GHz frequency doubling two-path phased-array frequency-modulated continuous-wave (FMCW) transceiver for automotive radar applications is proposed, by utilizing the frequency doubling scheme, the chirp bandwidth is improved, and the complexity of the frequency synthesizer and the insertion loss of the local-oscillating distribution network are both reduced.

Existing solutions may suffer from one or more of the following drawbacks:
- high sensitivity to the impedance of supply paths, which may be a critical issue for millimeter-wave applications,
- difficulty in providing low-impendence supply paths which are nevertheless a feature for their proper operation,
- controlling the supply-path impedance is a non-trivial task due to die complexity,
- high silicon area devices with multiple receive/transmit (RX/TX) channels,
- use of complex and power-consuming architectures,
- presence of trimming elements to adjust resonance of the load,
- the frequency doubler may suffer the present of "supply paths" whose impedance is hardly controllable.

SUMMARY

Embodiments provide method and devices to overcome one or more of the drawbacks discussed in the foregoing.

One or more embodiments may relate to a corresponding system.

One or more embodiments may relate to a corresponding vehicle (e.g., a motor car equipped with a circuit according to embodiments).

One or more embodiments provide a push-push frequency doubler almost insensitive to impedance of power supply paths.

In one or more embodiments, AC-isolation from power supply is achieved by exploiting DC-feed like components and a bypass return path.

One or more embodiments facilitate providing a high conversion gain by exploiting cascode topology. For instance, this facilitates reducing local oscillator input signal while providing a proper frequency doubled output signal.

One or more embodiments may present one or more of the following improvements:
- insensitivity to supply path impedance,
- low complexity and reduced current consumption,
- reduced silicon area footprint,
- absence of trimming elements.

BRIEF DESCRIPTION OF THE DRAWINGS

One or more embodiments will now be described, by way of non-limiting example only, with reference to the annexed Figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The drawings are in simplified form and are not to precise scale.

Throughout the figures annexed herein, like parts or elements are indicated with like references/numerals and a corresponding description will not be repeated for brevity.

The references used herein are provided merely for convenience and hence do not define the extent of protection or the scope of the embodiments.

Figure 1:
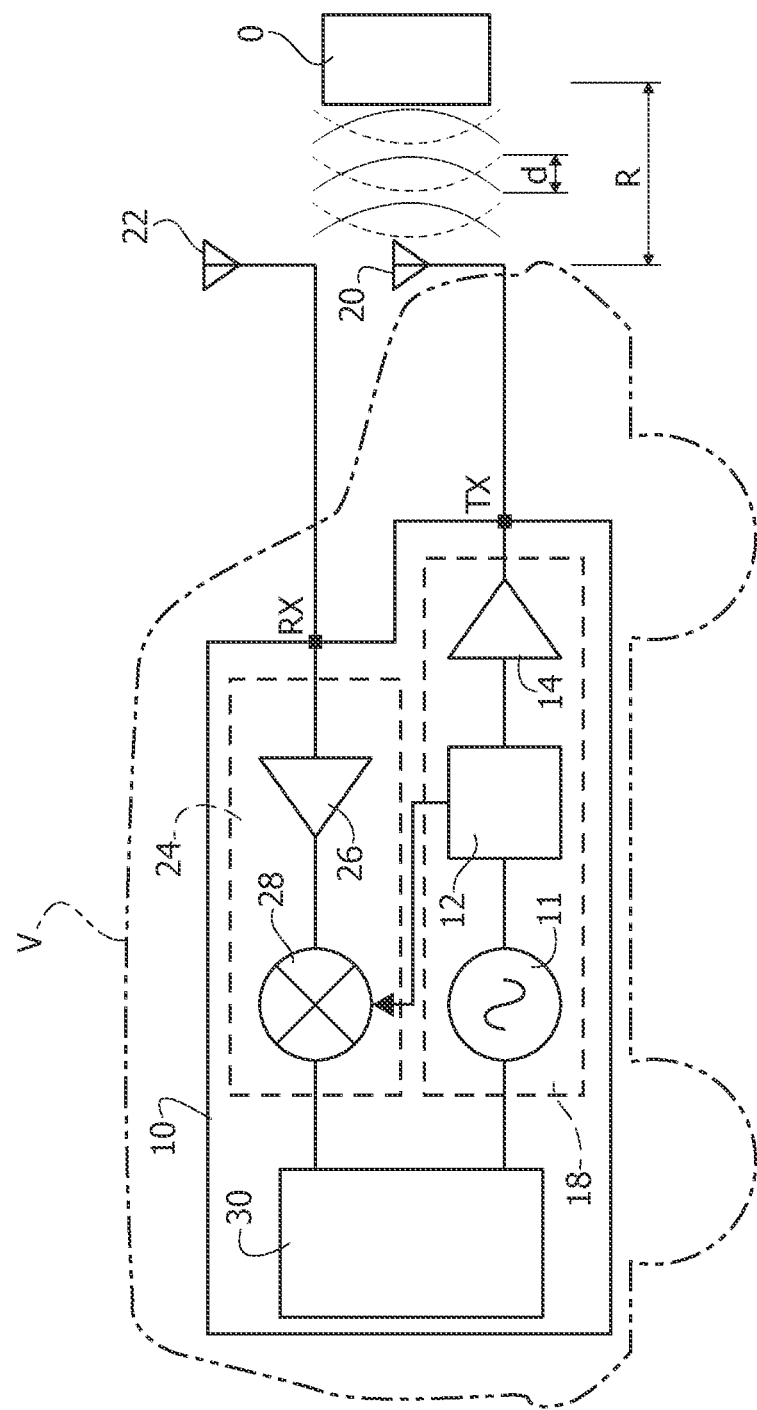
FIG. 1 is a diagram exemplary of a vehicle equipped with a system.

As exemplified in FIG. 1, a vehicle V can be equipped with a radar system 10 and antennas 20, 22 in order to detect an object O, for instance an obstacle along a traveling path of the vehicle V.

Distance R (and speed) of the object O are detected by measuring a time delay d between a transmitted signal (whose wave-front is shown in solid lines) and the received echo signal (whose wave-front is shown in dashed lines).

As exemplified in FIG. 1, the radar system 10, e.g., Frequency-Modulated Continuous-Wave (briefly, FMCW) radar system, comprises:

a transmitter chain 18, configured to provide a RF signal to drive a transmitting antenna 20, a receiver chain 24 configured to detect the echo signal reflected from the obstacle 0, a processing system 30 configured to drive the transmission of signals from the transmitter chain 18 and to process signals detected by the receiver chain 24.

As exemplified in FIG. 1, the transmitter chain 18 comprises:

a frequency synthesizer 11 configured to generate a local oscillator signal LO, a frequency multiplier 12 coupled to the synthesizer 11 and configured to receive the LO signal therefrom, the frequency multiplier 12 configured to provide an even harmonic of the LO signal, a (transmitter) amplifier, e.g., a Variable-Gain Amplifier (briefly, VGA) or a power amplifier (briefly, PA), coupled to the frequency multiplier 12 to receive the (even) harmonic of the LO signal therefrom, the amplifier 14 configured to amplify the harmonic of the LO signal produced via the frequency multiplier 12 and to operate/drive a transmission (briefly, TX) antenna 20 therewith.

As exemplified in FIG. 1, the corresponding incoming (echo) signal received at a receiving (briefly, RX) antenna 22 is fed to the receiver chain 24, comprising:

a low noise amplifier (LNA) 26, coupled to the antenna to receive the echo signal therefrom, and a mixer stage 28, coupled to the LNA 26 to receive the detected echo signal therefrom and coupled to the frequency multiplier 12 to receive the (even) harmonic of the local oscillator signal LO therefrom, the mixer stage 28 configured to produce a down-converted frequency signal IF based on the echo signal and the LO signal.

In one or more embodiments, the radar system 10 may be a system-on-chip integrated in a semiconductor device. For instance, the proposed frequency multiplier 12 can be integrated in a 28-nm FD-SOI CMOS technology device equipped on-board a transmitter stage of a mm-wave 77 GHz CMOS radar system.

As exemplified herein, the frequency multiplier circuitry is configured to produce a current signal having a second frequency value that is twice the first frequency value of the input signal.

For the sake of simplicity, one or more embodiments are discussed with respect to a frequency multiplier stage having a multiplication factor equal to two, that is a frequency doubler, being otherwise understood that such a multiplication factor is purely exemplary and in no way limiting. One or more embodiments apply to notionally any even integer multiplication factor.

Figure 2:
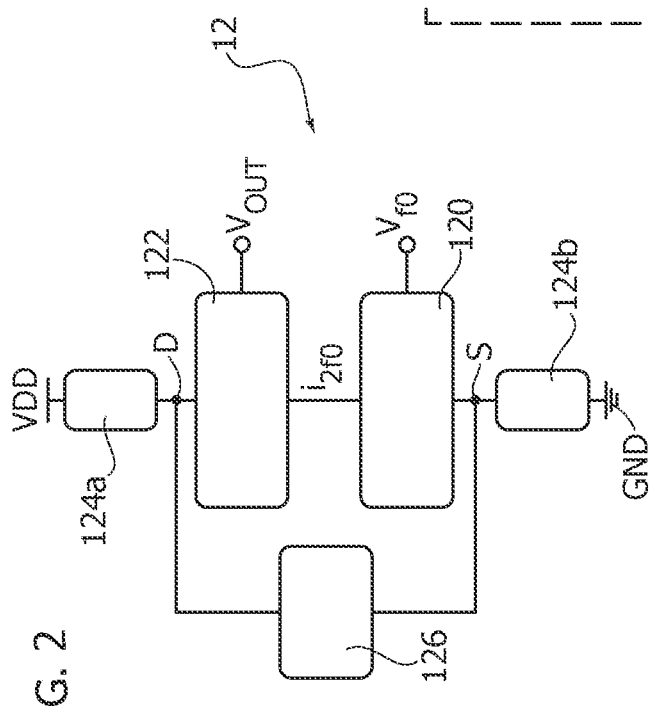
FIG. 2 is a diagram exemplary of a circuit.

As exemplified in FIG. 2, the frequency doubler 12 comprises:

a frequency multiplier 120 configured to receive a, e.g., high-quality, input signal $V_{f_0}$ at an input frequency $f_0$ and to produce a high frequency output signal $i_{2f_0}$ having an output signal frequency $2f_0$ multiple of the input signal frequency $f_0$ by an integer multiplication factor, e.g., a push-push voltage-to-current frequency doubler 120 configured to produce an output current signal $i_{2f_0}$ at twice the input frequency $f_0$, a transformer load 122 coupled to the frequency multiplier 120 and configured to receive the high frequency signal $i_{2f_0}$ therefrom, the transformer load 122 configured to provide a differential output signal $V_{OUT}$ to user circuits, e.g., to the power amplifier 14, power supply rails VDD, GND comprising a first power supply rail VDD configured to provide a voltage level VDD referred to a ground level GND and a second power supply rail GND configured to provide the ground level, shunt circuitry 124a, 124b, comprising a first, e.g., resonant, shunt circuit portion 124a interposed the first power supply rail VDD and a first node D of the transformer load 122 and a second, e.g., resonant, shunt circuit portion 124b, interposed the second power supply rail GND and a second node S of the frequency multiplier 120, a bypass current path 126, e.g., a bypass stage interposed the first node D of the transformer load 122 and the second node S of the frequency multiplier 120, the bypass stage 126 configured to couple the first power supply rail VDD with the second shunt resonator 124b and the second power supply rail GND to the first shunt circuit portion 124a.

In one or more embodiments, the input signal $V_{f0}$ has an input frequency value $f_0$ such that the multiplied frequency value $f_2$ of the frequency multiplied current signal $i_{2f0}$ lies in the millimeter wavelength range.

As exemplified in FIG. 3, the transformer load 122 comprises a primary winding Lp, Cp and a secondary winding Ls, Cs, the primary winding Lp, Cp having a primary capacitance Cp and a primary inductance Lp coupled to the frequency multiplier 120 (e.g., via the current line of a parallel arrangement of transistors $M_1$-$M_4$, as discussed in the following) and the secondary winding Ls, Cs having a secondary inductance Ls and a secondary capacitance Cs configured to provide the differential output signal $V_{OUT}$, e.g., to power amplifier 14.

Figure 3:
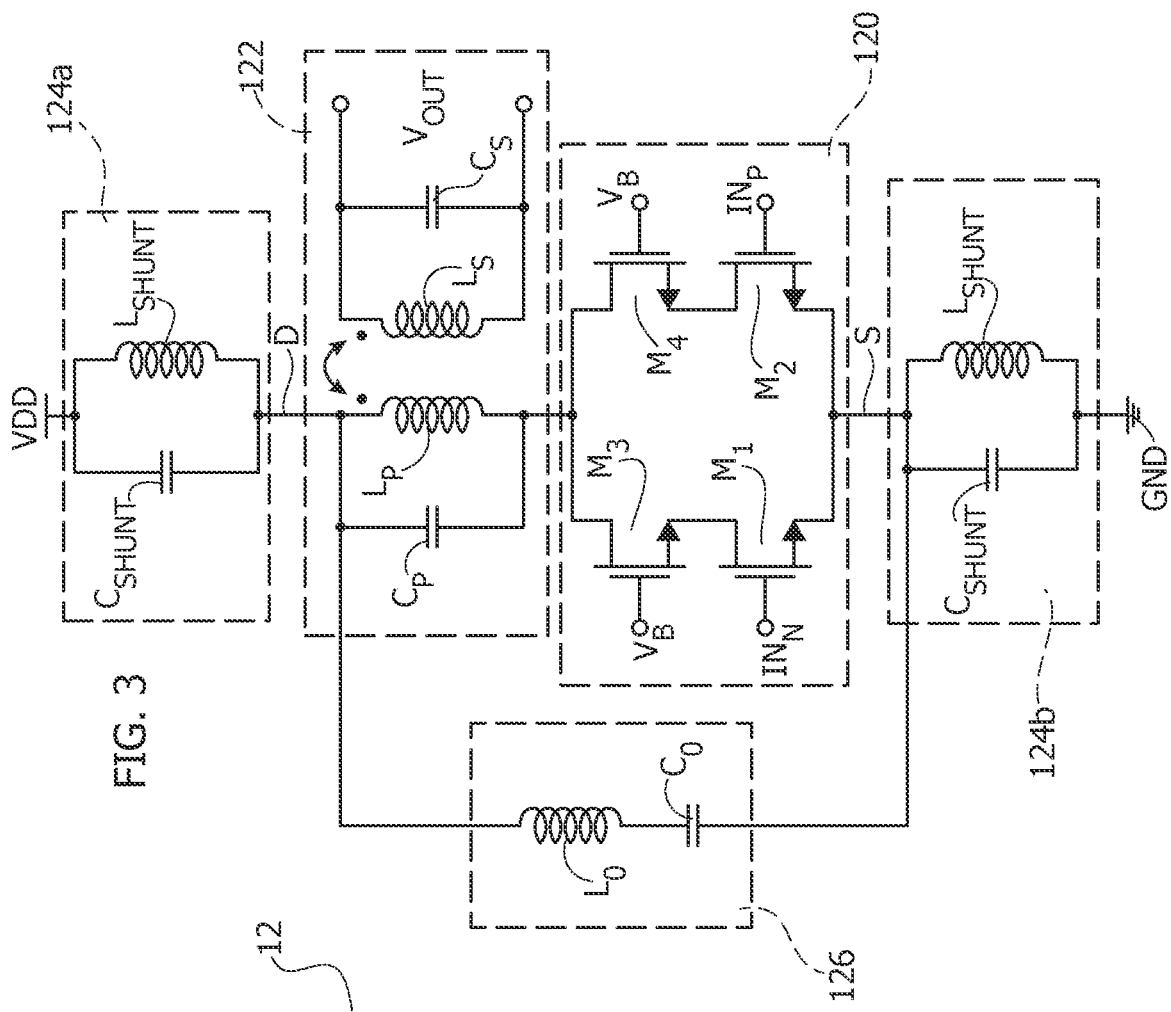
FIG. 3 is a diagram exemplary of an embodiment of the circuit.

As exemplified in FIG. 3, the frequency multiplier circuitry 120 exploits a balanced push-push arrangement, e.g., including a cascode pair of transistors $M_1$, $M_2$, $M_3$, $M_4$. This may facilitate providing an improved conversion gain, for instance thanks to a higher output resistance.

As exemplified in FIG. 3, a balanced push-push frequency multiplier 12 employs two sets of transistors $M_1$, $M_2$ and $M_3$, $M_4$ including:

a first set of transistors $M_1$, $M_2$ having a common current path therethrough and having respective control terminals $IN_N$, $IN_P$ configured to receive a differential input signal $V_{f0}$ (e.g., voltage difference between input node $IN_P$ and input node $IN_N$) at the input frequency $f_0$ and to be driven in anti-phase therebetween at the input frequency $f_0$, which is at one half the desired output frequency $2f_0$, and a second set of transistors $M_3$, $M_4$ having a common current path therethrough and having respective control terminals, $V_B$ configured to receive a proper biasing voltage.

As exemplified in FIG. 3, first transistors $M_1$, $M_3$ in the first and second sets of transistors $M_1$, $M_2$, $M_3$, $M_4$ and second transistors $M_2$, $M_4$ in the first and second sets of transistors $M_1$, $M_2$, $M_3$, $M_4$ have respective current paths therethrough arranged in parallel in a current line from the primary winding side Lp, Cp of the transformer 122, with the common node S coupled between the second shunt resonator 124b and the parallel arrangement of the first transistors $M_1$, $M_3$ and the second transistors $M_2$, $M_4$.

For instance, as the first transistor $M_1$ and the second transistor $M_2$ oscillate out-of-phase (that is, with a phase difference of 180° or $2\pi$ therebetween) with respect to each other, so that the fundamental frequency $f_0$ cancels out while an even harmonic, e.g., the second harmonic $2f_0$, adds in phase, providing the frequency multiplied (e.g., current) signal $i_{2f0}$.

As exemplified in FIG. 3, shunt circuit portions 124a, 124b, each comprise a (e.g., second harmonic $2f_0$) shunt resonator 124a, 124b, including at least one parallel arrangement of an inductance $L_{SHUNT}$ and a capacitance $C_{SHUNT}$, for instance as a tuned DC-feed.

In one or more alternative embodiments, shunt circuit portions 124a, 124b, comprise resonant networks (e.g., of order n) tuned or configured to provide a first (e.g., high) impedance value at the multiplied frequency 2f0 and a second (e.g., low DC) impedance value at frequencies different from the multiplied frequency 2f0, that is operating in a DC-feed like manner (known per se).

In one or more embodiments, the bypass stage 126 comprises a network configured to provide a first (e.g., low) impedance value at a frequency equal to said second frequency value of the frequency multiplied current signal and a second (e.g., high) impedance value at a DC level.

As exemplified in FIG. 3, the bypass stage 126 comprises a (e.g., second harmonic $2f_0$) series arrangement of an inductance $L_0$ and a capacitance $C_0$ as return path for signals at nodes D, S.

In an alternative embodiment, the bypass stage 126 may consist of a capacitor $C_0$.

In alternative embodiments, the bypass stage 126 may comprise a resonant circuit network, e.g., of order n, the network configured to provide a low impedance at the desired multiplied frequency (e.g., 2f0).

Figure 4:
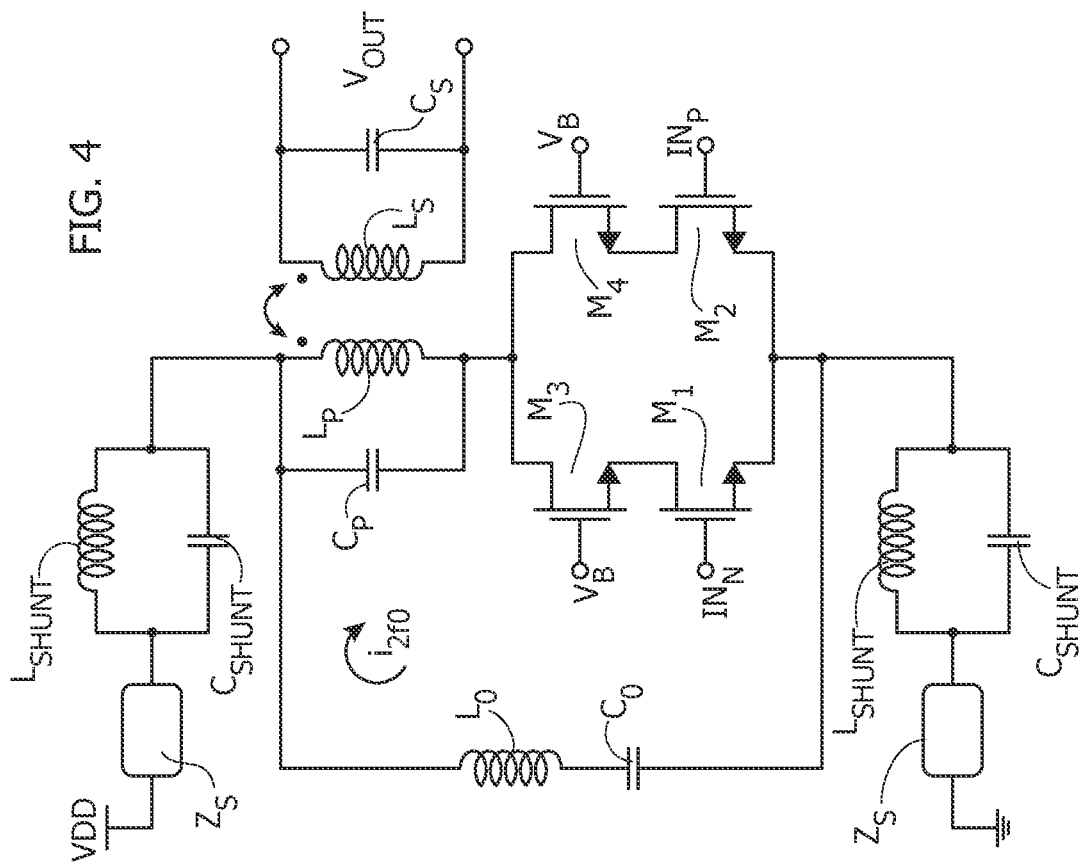
FIG. 4 is a diagram of principles underlying one or more embodiments.

As exemplified in FIG. 4, the power supply lines VDD, GND can have respective (parasitic) impedance Zs. For instance, shunt circuitry 124a, 124b, facilitates isolating nodes D, S from the power supply rails VDD, GND, thus preventing the high frequency current signal $i_{2f0}$ from flowing in the (parasitic impedance Zs of) DC supply rails VDD, GND.

As exemplified in FIG. 4, tuned bypass 126 coupled the nodes D, S and provides a current path for the high frequency current signal $i_{2f0}$. For instance, the tuned bypass comprises a resonator arrangement $L_0$, $C_0$ which does not suffer from (parasitic) impedance Zs of the power supply rails VDD, GND, facilitating maintaining an "unspoiled" frequency multiplied signal.

For instance, the bypass stage 126 comprises a resonating series arrangement of an inductance $L_0$ and a capacitance $C_0$ tuned to resonate at a frequency equal to said second frequency value of the frequency multiplied current signal $i_{2f0}$.

Figure 5:
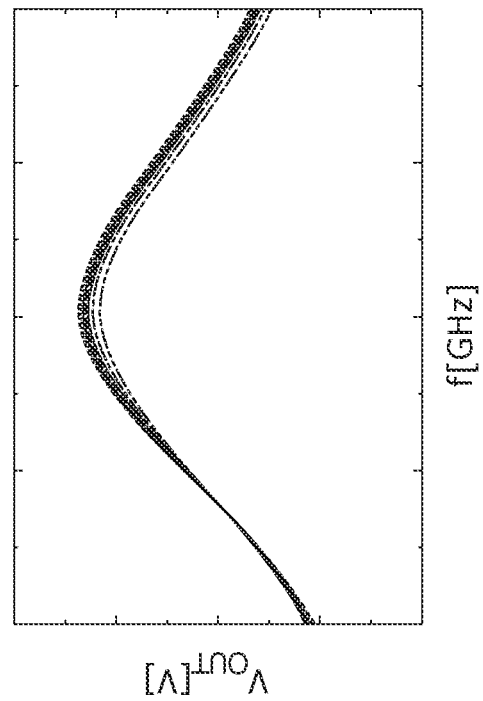
FIG. 5 is a diagram exemplary of one or more embodiments of signals of the circuit of FIG. 3.

As exemplified in FIG. 5, which is a plot of output voltage (in Voltage, ordinate scale) versus frequency (in GigaHertz, abscissa scale, where 1 GigaHertz=1 GHz=$10^9$ Hz) for various values of impedance Zs of the power supply VDD, GND, an arrangement as exemplified in FIG. 3 facilitates providing an output voltage $V_{OUT}$ whose amplitude is invariant with respect to the (parasitic) impedance $Z_S$ of the power supply rails VDD, GND.

Figure 6:
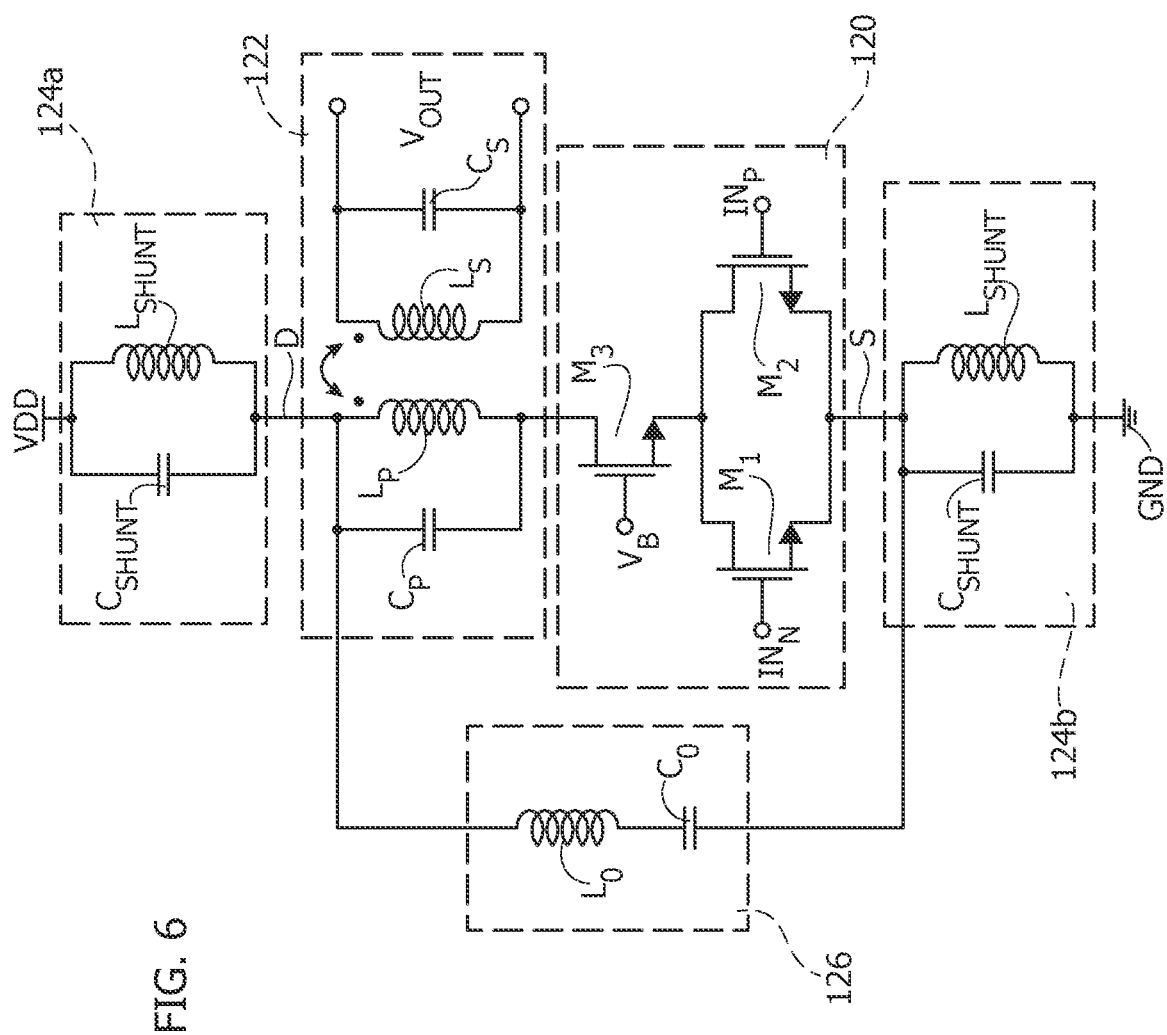
FIGS. 6-8 are diagrams exemplary of alternative embodiments of the circuit of FIG. 3.

As exemplified in FIG. 6, the frequency multiplier 120 comprises:

a first transistor $M_1$ having a first (e.g., gate) control terminal $IN_N$ configured to receive the input signal $V_{f0}$ and a second transistor $M_2$ having a second (e.g., gate) control terminal $IN_P$ configured to receive the anti-phase version of the input signal $V_{f0}$;

at least a third transistor $M_3$ arranged as a (e.g., common gate) buffer stage.

As exemplified in FIG. 6, the first transistor $M_1$, the second transistor $M_2$ and the buffer stage $M_3$ have respective current paths therethrough arranged (in particular, in series) in a current line from the primary inductance Lp of the transformer 122 to the second shunt resonator 124b, the first and second transistors having a common node S between the second shunt resonator 124b, and the parallel arrangement of the first transistor $M_1$ and the second transistor $M_2$. As exemplified in FIG. 7, the buffer stage comprises a pair of transistors $M_3$, $M_4$ forming a folded cascode arrangement with the first and second transistors $M_1$, $M_2$.

For instance, the folded cascode arrangement comprises:
a first transistor $M_1$ having a first control terminal $IN_N$ configured to receive the input signal $V_{f0}$ and a second transistor $M_2$ having a second control terminal $IN_P$ configured to receive the anti-phase version of said input signal $V_{f0}$,
a third and a fourth transistor $M_3$ and $M_4$ having terminal $V_B$ configured to receive a proper biasing voltage.

Figure 7:
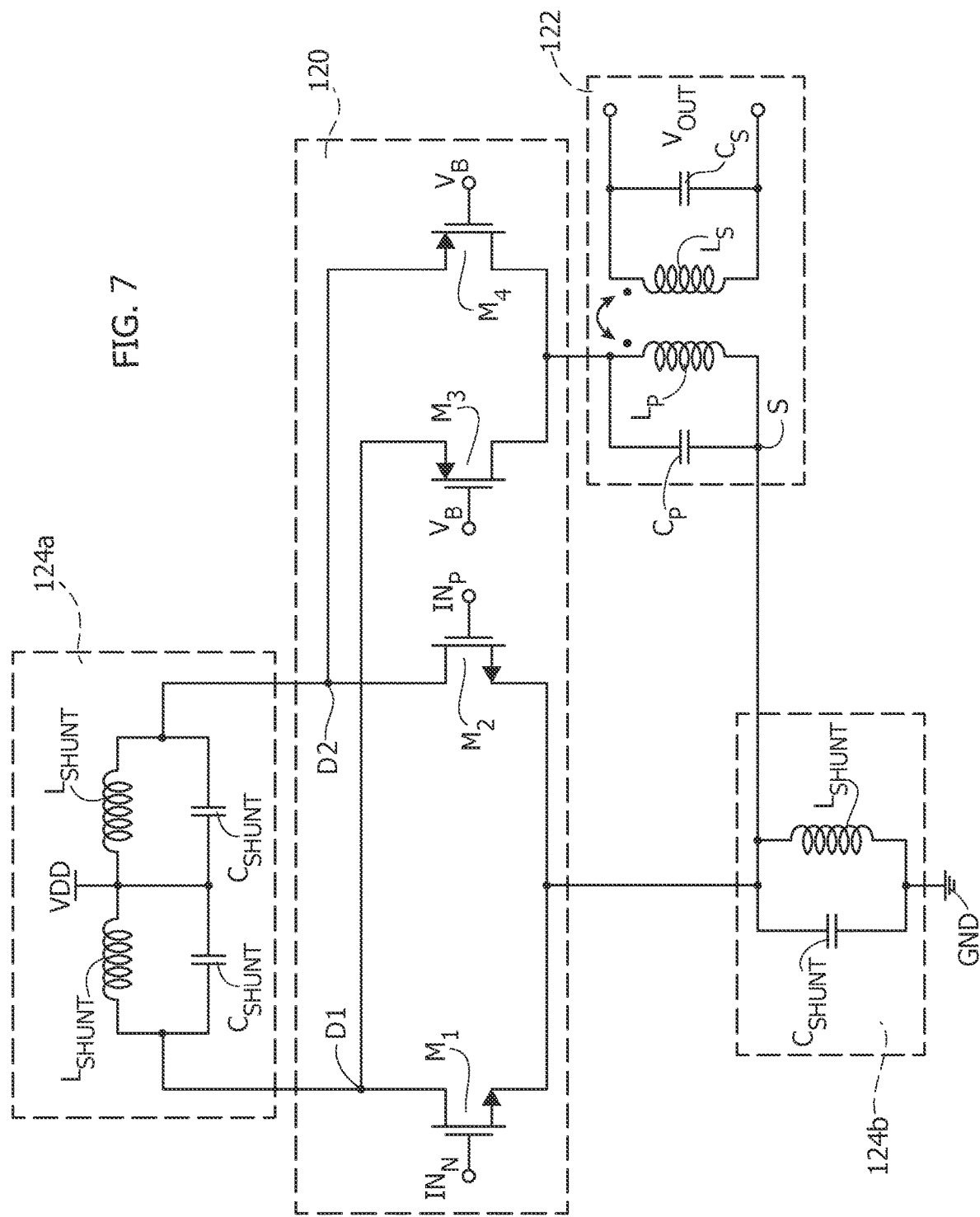

As exemplified in FIG. 7:
the first transistor $M_1$ has a first current path therethrough between a first node D1 of the frequency multiplier circuit 120 and the second shunt resonator 124b, the first node D1 coupled to the first shunt resonator 124a,
the second transistor $M_2$ has a second current path therethrough between a second node D2 of the frequency multiplier circuit 120 and the second shunt resonator 124b, the second node D2 coupled to the first shunt resonator 124a,
first and second transistors have respective current paths therethrough arranged in parallel and have a common node S between the second shunt resonator 124b and the parallel arrangement of the first transistor $M_1$ and the second transistor $M_2$,
the third transistor $M_3$ has a third current path therethrough between the first node D1 of the frequency multiplier circuit 120 and the primary inductance Lp of the primary winding side Cp, Lp of the transformer circuit 122,
the fourth transistor $M_4$ has a fourth current path therethrough between the second node D2 of the frequency multiplier circuit 120 and the primary inductance Lp of the primary winding side Cp, Lp of the transformer circuit 122,
the first transistor $M_1$ and the third transistor $M_3$ have respective current paths coupled therebetween and wherein said second transistor $M_2$ and said fourth transistor $M_4$ have respective current paths coupled therebetween.

Figures 8, 9:
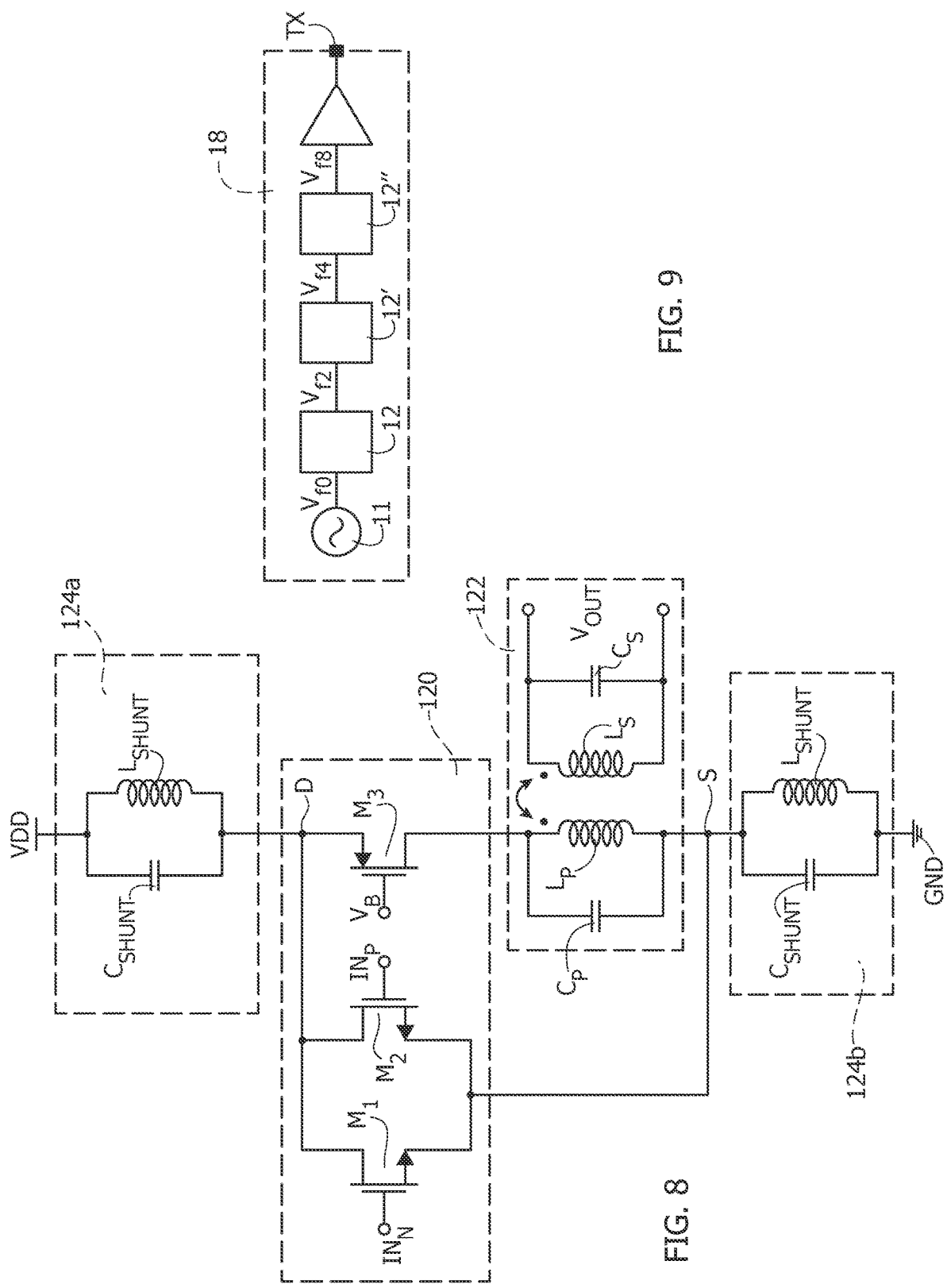
FIG. 9 is a diagram exemplary of a cascade arrangement.

As exemplified in FIG. 8, the frequency multiplier 120 comprises a common source frequency doubler $M_1$, $M_2$ with the buffer stage arranged as a folded common gate $M_3$, which has a current path therethrough along (e.g., in series) the current path of the first and second transistors $M_1$, $M_2$.

In one or more embodiments as exemplified in FIGS. 7 and/or 8, the bypass path providing a return path for the frequency multiplied current signal $i_{2f0}$ comprises transistors $M_3$ or $M_3$ and $M_4$. For instance, transistors $M_3$, $M_4$ are p-channel transistors and thus offer a "natural" current path for the current signal $i_{2f0}$ towards the common source node S.

As exemplified in FIG. 9, the frequency multiplier arrangement comprising a stack or cascade of frequency multiplier circuits 12, 12', 12".

For instance, the frequency multiplier arrangement comprising a cascaded arrangement of a plurality of circuits 12, 12', 12" where at least one of the circuits in the cascaded arrangement 12, 12', 12" has its input node (e.g., $V_{f2}$ of a second circuit 12' and/or $V_{f4}$ of a third circuit 12") coupled to an output node (e.g., $V_{f2}$ of a first circuit 12 and/or $V_{f4}$ of the second circuit 12') of another one of the circuits in the cascaded arrangement 12, 12', 12".

As exemplified in FIG. 9, the transmitter chain 18 equipped with such a cascade arrangement, comprises:
the frequency synthesizer 11, e.g., a voltage-controlled oscillator VCO, configured to generate an input signal $V_{f0}$ oscillating at an input frequency $f_0$,
a first frequency multiplier 12 coupled to the frequency synthesizer 11 and configured to receive the input signal $V_{f0}$ therefrom, the first frequency multiplier 12 configured to provide a first frequency multiplied signal $V_{f2}$ having first frequency $f_2$ as an even multiple, e.g., twice, of the input frequency $f_0$,
a second frequency multiplier 12', coupled to the first 12 and to a third frequency multiplier 12", the second frequency multiplier 12' configured to receive the first frequency multiplied signal $V_{f2}$ and to provide a second frequency multiplied signal $V_{f4}$ having a second frequency $f_4$ as an even harmonic of the first $f_2$ or input $f_0$ frequency, e.g., twice the first frequency $f_2$ and fourfold the input frequency $f_0$,
the third frequency multiplier 12", coupled to the second frequency multiplier 12' and configured to receive the second frequency multiplied signal $V_{f4}$ therefrom, the third frequency multiplier 12" configured to be further coupled to the power amplifier 14 (and/or to the mixer stage 28, as exemplified in FIG. 1) to provide thereto a third frequency multiplied signal $V_{18}$ having a third frequency $f_8$ as an even harmonic of the second $f_4$ or input $f_0$ frequency, e.g., twice the second frequency $f_4$ and eightfold the input frequency $f_0$.

For the sake of simplicity, the cascaded arrangement of circuits 12, 12', 12" illustrates three circuits forming such an arrangement, being otherwise understood that such a number of circuits is purely exemplary and in no way limiting. In particular, notionally any number of frequency multiplier circuits 12, 12', 12" may be stacked therebetween until a last N-th frequency multiplier 12 in the stack, receives a (N-1)-th frequency multiplied signal and provide (e.g., to the power amplifier 14 and/or to the mixer 28) a N-th multiplied signal having frequency 2N-fold the input frequency $f_0$, e.g., $f_N=2*N*f_0$.

As exemplified herein, a frequency multiplier arrangement comprises a cascaded arrangement of a plurality of circuits (for instance, 12, 12', 12") as per the present disclosure, wherein at least one of the circuits in the cascaded arrangement has its input node (for instance, $V_{f0}$, $V_{f2}$, $V_{f4}$) coupled to the output node (for instance, $V_{f2}$, $V_{f4}$, $V_{f8}$) of another one of the circuits in the cascaded arrangement.

As exemplified herein, a (e.g., radar) system (for instance, 10, 18) comprises:
a circuit or a frequency multiplier arrangement as per the present disclosure, and
a power amplifier (for instance, 14) coupled to the circuit and configured to receive the frequency multiplied voltage signal therefrom, the power amplifier configured to amplify the frequency multiplied voltage signal and to provide an amplified frequency multiplied signal (for instance, TX) as a result,
a transmitter antenna (for instance, 20) coupled to the power amplifier and configured to transmit the amplified frequency multiplied signal.

As exemplified herein, the system comprises a frequency synthesizer (for instance, 11) coupled to the circuit and configured to provide thereto the input signal at the first frequency.

As exemplified herein, a radar system configured to be equipped on a vehicle (for instance, V) further includes:
- a receiver antenna (for instance, 22) configured to receive an echo signal based on the transmitted amplified frequency multiplied signal (for instance, TX),
- a mixer stage (for instance, 28) coupled to the circuit or the frequency multiplier arrangement, the mixer stage configured to apply frequency mixing to the frequency multiplied voltage signal and to the echo signal, producing a mixed signal as a result.

As exemplified herein, a circuit (for instance, 12), comprises:
- a frequency multiplier circuit (for instance, 120) having input nodes (for instance, $IN_P$, $IN_N$) configured to receive an input signal (for instance, $V_{f0}$) and an anti-phase version thereof, the input signal having a first frequency value, the frequency multiplier circuitry (for instance, frequency doubler circuitry) configured to produce a current signal (for instance, $i_{2f0}$) at a second frequency value that is an even multiple (for instance, falling in the millimeter wave range) of said first frequency value,
- a transformer (for instance, 122) comprising a primary winding (for instance, Lp, Cp) and a secondary winding (Ls, Cs), wherein the primary winding of the transformer comprises a primary inductance (for instance, Lp) coupled (for instance, 126) to the frequency multiplier circuitry to receive the current signal therefrom, wherein the secondary winding of the transformer is configured to provide a frequency multiplied voltage signal (for instance, $V_{OUT}$), in particular based on the current signal at the second frequency value received from the frequency multiplier circuitry,
- wherein the frequency multiplier circuit and the transformer are cascaded between at least one first node (for instance, D; D1, D2) and a second node (for instance, S), the at least one first node and the second node configured to be coupled to a supply node (for instance, VDD) and ground (for instance, GND),
- a first shunt resonator (for instance, 124a) coupled between the supply node and the at least one first node,
- a second shunt resonator (for instance, 124b) coupled between the second node and ground, and
- a bypass current path (for instance, 126; M3, M4) coupled between the at least one first node and said second node.

As exemplified herein, the transformer is arranged:
intermediate the at least one first node and the frequency multiplier circuit, or
intermediate the frequency multiplier circuit and the second node.

As exemplified herein, the frequency multiplier circuit comprises:
- a first transistor (for instance, $M_1$) having a first control terminal (for instance, $IN_N$) configured to receive the input signal and a second transistor (for instance, $M_2$) having a second control terminal (for instance, $IN_P$) configured to receive the anti-phase version of said input signal, the first transistor and the second transistor having a common source node and respective current paths therethrough arranged in parallel in a current line from the at least one node to the second node.

As exemplified herein, the frequency multiplier circuit further comprises at least one third transistor (for instance, $M_3$) having a control terminal (for instance, $V_B$) configured to receive a biasing voltage and the bypass current path (for instance, 126) therethrough along the current line from the at least one node to the second node.

As exemplified herein, the frequency multiplier circuit further comprises:
- a third transistor (for instance, $M_3$) having a third control terminal (for instance, $V_B$) configured to receive a biasing voltage and a fourth transistor (for instance, $M_4$) having a fourth control terminal (for instance, $V_B$) configured to receive the biasing voltage; the third transistor and the fourth transistor having a common node and respective bypass current paths (for instance, 126) therethrough arranged in parallel in a current line from the at least one node to the second node, wherein the first transistor and the third transistor have respective current paths coupled therebetween and wherein said second transistor and said fourth transistor have respective current paths coupled therebetween.

As exemplified herein, the frequency multiplier circuit comprises:
- a first transistor (for instance, $M_1$) having a first control terminal (for instance, $IN_N$) configured to receive the input signal and a second transistor (for instance, $M_2$) having a second control terminal (for instance, $IN_P$) configured to receive the anti-phase version of said input signal,
- wherein the first transistor has a first current path therethrough between a first node (for instance, D1) of the at least one node,
- wherein the second transistor has a second current path therethrough between a second node (for instance, D2) of the at least one node,
- wherein the first and second transistors have a common source node and respective current paths therethrough arranged in parallel,
- the frequency multiplier circuit further comprising a third transistor (for instance, $M_3$) having a third control terminal (for instance, $V_B$) configured to receive a biasing voltage and a fourth transistor (for instance, $M_4$) having a fourth control terminal (for instance, $V_B$) configured to receive a biasing voltage,
- wherein the third transistor has a third current path therethrough between the first node of the at least one node and the primary inductance of the primary winding of the transformer circuit,
- wherein the fourth transistor has a fourth current path therethrough between the second node of the at least one node and the primary inductance of the primary winding of the transformer circuit,
- wherein the first transistor and the third transistor have respective current paths coupled therebetween and wherein said second transistor and said fourth transistor have respective current paths coupled therebetween.

As exemplified herein:
the bypass current path comprises a resonating series arrangement of an inductance (for instance, $L_0$) and a capacitance (for instance, $C_0$) tuned to resonate at a frequency equal to said second frequency value of the frequency multiplied current signal ($i_{2f0}$), and/or
at least one of the first shunt resonator and the second shunt resonator comprises a resonant circuit network tuned to provide a first (e.g., low) impedance value at a frequency equal to said second frequency value of the frequency multiplied current signal and a second (e.g., high) impedance value at a frequency different from said second frequency value of the frequency multiplied current signal.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection. The extent of protection is defined by the annexed claims.

What is claimed is:

1. A circuit comprising:
   frequency multiplier circuitry having input nodes configured to receive an input signal and an anti-phase version thereof, the input signal having a first frequency value, wherein the frequency multiplier circuitry is configured to produce a current signal at a second frequency value that is an even multiple of the first frequency value;
   a transformer comprising a primary side and a secondary side, wherein the primary side comprises a primary inductance coupled to the frequency multiplier circuitry to receive the current signal therefrom, wherein the secondary side is configured to provide a frequency multiplied voltage signal, and wherein the frequency multiplier circuitry and the transformer are cascaded between at least one first node and a second node, the at least one first node and the second node couplable to a supply node and ground;
   a first shunt resonator coupled between the supply node and the at least one first node;
   a second shunt resonator coupled between the second node and the ground; and
   a bypass current path coupled between the at least one first node and the second node.

2. The circuit of claim 1, wherein the transformer is arranged between the at least one first node and the frequency multiplier circuitry.

3. The circuit of claim 1, wherein the transformer is arranged between the frequency multiplier circuitry and the second node.

4. The circuit of claim 1, wherein the frequency multiplier circuitry comprises a first transistor having a first control terminal configured to receive the input signal and a second transistor having a second control terminal configured to receive the anti-phase version of the input signal, the first transistor and the second transistor having respective current paths therethrough arranged in parallel in a current line from the at least one first node to the second node and a common source node.

5. The circuit of claim 4, wherein the frequency multiplier circuitry further comprises at least one third transistor having a control terminal configured to receive a biasing voltage and the bypass current path therethrough along the current line from the at least one first node to the second node.

6. The circuit of claim 4, wherein the frequency multiplier circuitry further comprises a third transistor having a third control terminal configured to receive a biasing voltage and a fourth transistor having a fourth control terminal configured to receive the biasing voltage, the third transistor and the fourth transistor having respective bypass current paths therethrough arranged in parallel in the current line from the at least one first node to the second node and a common node, wherein the first transistor and the third transistor have respective current paths coupled therebetween, and wherein the second transistor and the fourth transistor have respective current paths coupled therebetween.

7. The circuit of claim 1,
   wherein the frequency multiplier circuitry comprises a first transistor having a first control terminal configured to receive the input signal and a second transistor having a second control terminal configured to receive the anti-phase version of the input signal,
   wherein the first transistor has a first current path therethrough between a first node of the at least one first node,
   wherein the second transistor has a second current path therethrough between a second node of the at least one first node,
   wherein the first and second transistors have a common source node and respective current paths therethrough arranged in parallel,
   wherein the frequency multiplier circuitry further comprising a third transistor having a third control terminal configured to receive a biasing voltage and a fourth transistor having a fourth control terminal configured to receive the biasing voltage,
   wherein the third transistor has a third current path therethrough between the first node of the at least one first node and the primary inductance of the primary side,
   wherein the fourth transistor has a fourth current path therethrough between the second node of the at least one first node and the primary inductance of the primary side of the transformer, and
   wherein the first transistor and the third transistor have respective current paths coupled therebetween and wherein said second transistor and the fourth transistor have respective current paths coupled therebetween.

8. The circuit of claim 1,
   wherein the bypass current path comprises a resonating series arrangement of an inductance and a capacitance configured to resonate at a frequency equal to the second frequency value of the frequency multiplied current signal, and/or
   wherein at least one of the first shunt resonator and the second shunt resonator comprises a resonant circuit network configured to provide a first impedance value at the frequency equal to the second frequency value of the frequency multiplied current signal and a second impedance value at a frequency different from the second frequency value of the frequency multiplied current signal.

9. The circuit of claim 1, wherein the frequency multiplier circuitry is configured to produce the current signal having the second frequency value that is twice the first frequency value of the input signal.

10. A frequency multiplier arrangement comprising:
    a cascaded arrangement of a plurality of circuits,
    wherein each circuit of the plurality of circuits is the circuit according to claim 1,
    wherein at least one of the circuits in the cascaded arrangement has its input node coupled to an output node of another one of the circuits in the cascaded arrangement.

11. A system comprising:
    the frequency multiplier arrangement according to claim 10; and
    a power amplifier coupled to the circuit and configured to receive the frequency multiplied voltage signal therefrom, the power amplifier configured to:

amplify the frequency multiplied voltage signal, and provide an amplified frequency multiplied signal as a result; and a transmitter antenna coupled to the power amplifier and configured to transmit the amplified frequency multiplied signal.

12. The system of claim 11, further comprising a vehicular radar system comprising:

a receiver antenna configured to receive an echo signal based on the transmitted amplified frequency multiplied signal; and a mixer stage coupled to the frequency multiplier arrangement, the mixer stage configured to apply frequency mixing to the frequency multiplied voltage signal and to the echo signal thereby producing a mixed signal as a result.

13. A system comprising:

the circuit according to claim 1;

a power amplifier coupled to the circuit and configured to receive the frequency multiplied voltage signal therefrom, the power amplifier configured to:

amplify the frequency multiplied voltage signal, and provide an amplified frequency multiplied signal as a result; and a transmitter antenna coupled to the power amplifier and configured to transmit the amplified frequency multiplied signal.

14. The system of claim 13, further comprising a frequency synthesizer coupled to the circuit and configured to provide thereto the input signal at the first frequency value.

15. The system of claim 14, wherein the frequency synthesizer is configured to provide the input signal at the first frequency value such that the second frequency value of the frequency multiplied voltage signal lies in a millimeter wavelength range.

16. The system of claim 13, further comprising a vehicular radar system comprising:

a receiver antenna configured to receive an echo signal based on the transmitted amplified frequency multiplied signal; and a mixer stage coupled to the circuit, the mixer stage configured to apply frequency mixing to the frequency multiplied voltage signal and to the echo signal, thereby producing a mixed signal as a result.

17. A vehicle comprising:

the system according to claim 13.

* * * * *